United States Patent [19]
Kolbenschlag

[11] Patent Number: 5,159,196
[45] Date of Patent: Oct. 27, 1992

[54] APPARATUS AND METHOD FOR DISCHARGING A SPECIMEN DISPOSED IN AN EVACUATED CHAMBER

[75] Inventor: Nikolaus Kolbenschlag, Munich, Fed. Rep. of Germany

[73] Assignee: Siemens Aktiengesellschaft, Munich, Fed. Rep. of Germany

[21] Appl. No.: 728,515

[22] Filed: Jul. 11, 1991

[30] Foreign Application Priority Data

Jul. 31, 1990 [DE] Fed. Rep. of Germany ....... 4024336

[51] Int. Cl.$^5$ .............................................. H01J 37/26
[52] U.S. Cl. .................... 250/310; 250/306; 250/309; 250/311; 361/213
[58] Field of Search ............... 250/306, 310, 311, 309; 361/213

[56] References Cited

U.S. PATENT DOCUMENTS 4,249,077  2/1981  Crawford ........................... 250/306

FOREIGN PATENT DOCUMENTS 1-286242  11/1989  Japan .................. 250/310

OTHER PUBLICATIONS

"Wafer Decharging During Electron-Beam Exposure", IBM Technical Disclosure Bulletin, vol. 27, No. 11, Apr., 1985, pp. 6388-6389.

"Oscillatory Scattered Ion Yields From Nonconductive Materials", by D. L. Christensen et al., Nuclear Instruments and Methods 149 (1978), pp. 587-589.

"Charge neutralisation of insulating surfaces in the SEM by gas ionisation", J. Phys. D: Appl. Phys., vol. 11, 1978, pp. 2315-2325.

Primary Examiner—Jack I. Berman
Attorney, Agent, or Firm—Hill, Van Santen, Steadman & Simpson

[57] ABSTRACT

In order to be able to investigate non-conductive specimens in an electron beam apparatus in a charge-neutral manner, a charge applied by the scanning electron beam is neutralized with the assistance of charge carriers present in a metal plasma. The plasma is generated by a gas discharge between two electrodes positioned with the vacuum specimen chamber of the electron beam apparatus. One of these electrodes has a layered structure (e.g. metal-insulator-metal) that facilitates the ignition of the gas discharge by means of a high-voltage pulse.

21 Claims, 1 Drawing Sheet

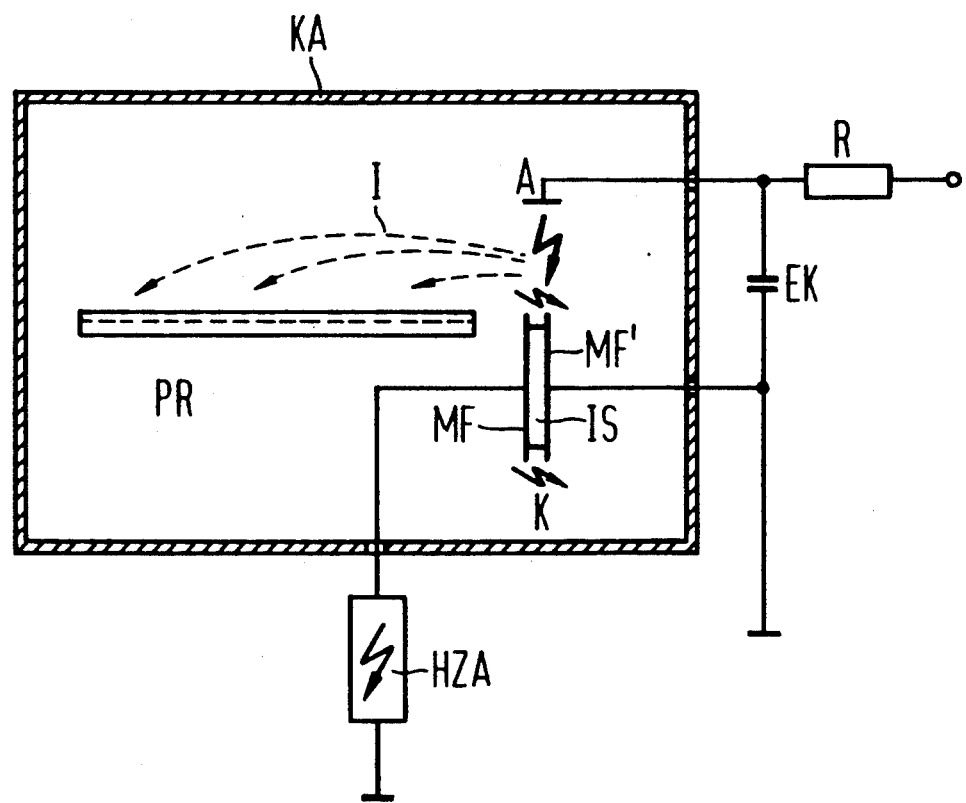

APPARATUS AND METHOD FOR DISCHARGING A SPECIMEN DISPOSED IN AN EVACUATED CHAMBER

BACKGROUND OF THE INVENTION

The present invention generally is directed to methods for removing a charge on a specimen. More particularly, the invention is directed to a method for electrically discharging a specimen positioned within a vacuum chamber of an electron scanning device.

there is an increasing need for scanning electron microscopes in all areas of the development and manufacture of microelectronic and optoelectronic components in order to be able to visually evaluate structures on a sub-micrometer scale thereby to identify deviations from specified patterns and in order to be able to acquire and evaluate topographical parameters such as heights, widths or angles of inclination. Conventional scanning electron microscopes, however, do not have the required spatial resolution of fractions of a micrometer through a few nanometers at voltages below approximately 20 kV. However, at voltages above about 20 kV, resist structures and intergrated circuits are damaged due to the high-energy electrons. Further, non-conductive specimens become charged.

In order to produce an adequately high surface or, respectively, volume conductivity so that a non-conductivity specimen can be observed in a scanning electron microscope, non-conductive specimens are usually vapor-deposited with a thin metal layer to thereby be provided with a conductive surface. A metalization of the surface, however, cannot be used when the specimen is to be re-employed or is to be subjected to further treatment after its examination in the scanning electron microscope.

In order to also be able to image and investigate non-metalizable specimens in a charge-neutral manner, an attempt has been made to match the energy of the electrons to what is referred to as the neutral point energy of the specimen material. Since the neutral point energy is generally not exactly known, local chargings that influence the electron beam and diminish the spatial resolution occur over and over again.

In IBM Technical Disclosure Bulletin, Volume 27, No. 11 (1985), pages 6388–6389 fully incorporated herein by reference, there is disclosed a method for discharging a semiconductor wafer situated in an electron beam system. The elimination of the charges applied by the electron probe ensues therein via a photoconductive layer that is produced by irradiating the wafer with ultra violet light.

It is also known to remove the charge present on a specimen with the assistance of an electron beam or ion beam directed onto the specimen surface as discussed, for example, U.S. Pat. No. 4,249,077, fully incorporated herein by reference, and Nuclear Instruments and Methods 149, 1978, pages 587–590, also fully incorporated herein by reference. In the method disclosed in J. Phys. D: Applied Physics, Volume 11, 1978, pages 2315–2325, fully incorporated herein by reference, nitrogen ions which serve to neutralize a specimen charge are generated in an electron surge in an electrical field built up above the specimen.

SUMMARY OF THE INVENTION

The present invention provides an apparatus and method for a rapid electron discharge of large-area specimens.

To this end, the present invention provides a method and structure wherein a plasma is generated by igniting a gas discharge within the vacuum chamber in which the specimen is situated. In a preferred embodiment, the plasma generated is a metal plama.

In an embodiment of the invention, a gas discharge is ignited between two electrodes subjected to a voltage thereacross of between about 50 to 500 volts.

In an embodiment of the invention, one of the electrodes is constructed to have a metal-insulator-metal layered structure.

An advantage of the invention is that large-area specimens, particularly printed circuits boards having dimensions of, for example, $13 \times 13$ cm$^2$ can be completely discharged within the shortest possible time.

These and other features of the invention will become clear with reference to the following detailed description of the preferred embodiments and accompanying drawing.

BRIEF DESCRIPTION OF THE DRAWING

FIG. 1 schematically illustrates an apparatus and method for carrying out the invention.

DETAILED DESCRIPTION OF THE PRESENTLY PREFERRED EMBODIMENTS

In accordance with the invention, electron charges on a specimens subjected to electron-beam scanning are discharged by generating a plasma within the vacuum chamber of the electron scanner. To this end, a gas discharge is ignited within the chamber. In FIG. 1 there is illustrated schematically an apparatus and method suitable for carrying out the foregoing.

The method of the invention utilizes a gas discharge in a high-vacuum in order to generate the plasmas with the ions and electrons that serve to neutralize a specimen charge. Preferably, the gas discharge occurs between two electrodes A and K positioned within an evacuated (vacuum) specimen chamber KA (the pressure p being less than $10^{-4}$–$10^{-6}$ Torr).

The electrode K serves as a cathode and preferably is composed of two copper or silver foils MF and MF' and of an insulator IS arranged between the foils. The metal-insulator-metal layered structure of the electrode K guarantees that a voltage pulse generated, e.g., with a conventional motor vehicle ignition system HZA, leads to a spark discharge between the metal foil MF connected to the ignition system HZA and the metal foil MF' coupled to the ground.

The spark discharge is used to trigger the gas discharge, the gas discharge occurring between the electrodes A and K which are spaced apart by a distance of approximately 1 through 10 mm. The discharge generates a metal plasma that fills out the chamber KA and that contains enough ions and electrons in order to be able to completely discharge even large-area specimens PR within the shortest possible time.

A switch-resistant capacitor EK particularly comes into consideration as voltage source for the anode A (anode voltage $U_A = +50$ through $+500$ volts), the capacitance thereof defining the number of charge carriers I released in the plasma and, thus, defining the time required for the discharge of the specimen PR. A power pack means that is preceded by a protective resistance R is employed for charging a capacitor EK used to generate the discharge events.

It has been demonstrated in tests that three to four discharges of the capacitor EK (whose capacitance C preferably is 100 µF, and subjected to a voltage $U_{EK}$ of 100 volts) suffice in order to neutralize the charging of a printed circuit board approximately $13 \times 13$ cm² in size caused by an electron beam. The rise of the chamber pressure produced by the plasma is only of a brief duration since the metal vapor produced condenses very quickly.

To be sure, anode material and cathode material evaporates during every discharge event. However, the loss of material given capacitor EK capacitances C of less than about 1000 µF is not excessively high and, in fact, is so low that the electrodes do not have to be replaced until after several thousand discharge events.

The invention, of course, is not limited to the exemplary embodiments that have been set forth. Instead of copper or silver, for example, other metals can be employed for manufacturing the cathode foils MF and MF'. These metals used, however, must have good thermal conductivity and a stability that is adequate for the electrode temperatures that occur during the gas discharge.

Finally, in order to avoid damage to detectors present in the specimen chamber of a scanning electron microscope, of an electron beam measuring instrument or of an ion beam instrument, due to the flash occurring upon the gas discharge, the detectors should be shut off during the discharge event.

While preferred embodiments have been shown, modifications and changes may become apparent to those skilled in the art which shall fall within the spirit and scope of the invention. It is intended that such modifications and changes be covered by the attached claims.

What is claimed is:

1. A method for electrically discharging a specimen positioned within a vacuum chamber, comprising the step of generating a short-lived plasma in the chamber by igniting a gas discharge by means of a spark.

2. The method of claim 1, wherein the plasma generated is a metal plasma.

3. The method of claim 1, wherein the step of igniting the gas discharge including igniting the gas with a high-voltage spark.

4. The method of claim 1, wherein the gas discharge is ignited between two electrodes, whereby a difference in potential between the electrodes amounts to between about 50 through 500 volts.

5. The method of claim 1, wherein an electrode is employed that comprises a metal-insulator-metal layered structure.

6. The method of claim 5, wherein one of the metal layers is connected to a high-voltage igniton system.

7. The method of claim 1, wherein the gas discharge is periodically ignited.

8. An apparatus for neutralizing a charge on a specimen in an examination chamber of a particle beam device comprising first and second electrodes arranged in the chamber, one of the electrodes comprising a metal-insulator-metal layered structure; a high-voltage ignition system operatively coupled to the electrode comprising the metal-insulator-metal layered structure for generating a spark that ignites a gas discharge; and means for generating a difference in potential between the first and the second electrodes for generating the spark.

9. The apparatus of claim 8, wherein the means for generating a difference in potential between the first and second electrodes comprises a capacitor.

10. The apparatus of claim 8, wherein the electrode with the layered structure comprises two copper metal foil layers separated by an insulator layer.

11. The apparatus of claim 8, wherein the electrode with the layered structure comprises two silver foil layers separated by an insulator layer.

12. The apparatus of claim 8, wherein the particle beam device comprises an electron beam device.

13. The apparatus of claim 8, wherein the particle comprises a scanning electron microscope.

14. The apparatus of claim 8, wherein the particle comprises an ion beam device.

15. A method for neutralizing charges on a specimen in a vacuum chamber of a particle beam scanning device, comprising the steps of:
generating a discharge between two electrodes; and
generating a short-lived plasma with charge carriers suitable to neutralize the charge on the specimen.

16. The method of claim 15, wherein the step of generating a discharge comprises subjecting the electrodes to a potential difference of between about 50 and 500 volts.

17. The method of claim 16, wherein the electrodes are spaced apart by about 1 to 10 mm.

18. The method of claim 15, wherein the step of generating a plasma comprises generating charges carried in an amount sufficient to neutralize charges on a specimen $13 \times 13$ cm² in size.

19. The method of claim 15, wherein the particle beam scanning device comprises an electron beam scanning device.

20. The method of claim 15, wherein the particle beam scanning device comprises a scanning electron microscope.

21. The method of claim 15, wherein the particle beam scanning device comprises an ion beam device.

* * * * *